United States Patent
Oh et al.

(10) Patent No.: US 8,515,700 B2
(45) Date of Patent: Aug. 20, 2013

(54) APPARATUS AND METHOD FOR ESTIMATING STATE OF HEALTH OF BATTERY OF VEHICLE

(75) Inventors: Joongseok Oh, Gyeonggi-do (KR); Manjae Park, Gyeonggi-do (KR); Sangjin Heo, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 320 days.

(21) Appl. No.: 12/953,678

(22) Filed: Nov. 24, 2010

(65) Prior Publication Data

US 2012/0078549 A1 Mar. 29, 2012

(30) Foreign Application Priority Data

Sep. 27, 2010 (KR) .......................... 10-2010-0093085

(51) Int. Cl.
*G06F 19/00* (2011.01)

(52) U.S. Cl.
USPC .......................................................... 702/63

(58) Field of Classification Search
USPC ............................ 702/63; 324/427; 320/132
See application file for complete search history.

(56) References Cited

U.S. PATENT DOCUMENTS

2008/0120050 A1* 5/2008 Iwane et al. .................... 702/63
2011/0112781 A1* 5/2011 Anderson et al. ............... 702/63

FOREIGN PATENT DOCUMENTS

| JP | 11-218567 A | 8/1999 |
| JP | 2003-107139 A | 4/2003 |
| JP | 2006-189436 A | 7/2006 |
| JP | 2007-215332 A | 8/2007 |
| JP | 2009-208484 A | 9/2009 |
| KR | 10-2001-0096259 A | 11/2001 |
| KR | 10-2007-0003631 A | 1/2007 |
| KR | 10-0740114 B1 | 7/2007 |
| KR | 10-0892821 B1 | 4/2009 |
| KR | 10-2010-0063343 | 6/2010 |

* cited by examiner

*Primary Examiner* — Bryan Bui
(74) *Attorney, Agent, or Firm* — Edwards Wildman Palmer LLP; Peter F. Corless

(57) ABSTRACT

An apparatus and a method for estimating the SOH of a battery of a vehicle are provided, in which degree of deterioration of the battery is estimated from temperature change and traveling distance. Accordingly, the SOH of the battery and remaining traveling distance can be accurately estimated.

7 Claims, 5 Drawing Sheets

| TEMPERATURE[°C] | SEVERITY GRADE | |
|---|---|---|
| | T1 | T2 |
| T1+20 | 25 | 10 |
| T1+15 | 15 | 5 |
| T1+12.5(T2) | 10 | 1.00 |
| T1+10 | 5 | 0.5 |
| T1+5 | 2.5 | 0.25 |
| T1 | 1.0 | 0.125 |
| T1-5 | 0.5 | 0.06 |
| T1-10 | 0.25 | 0.03 |

APPARATUS AND METHOD FOR ESTIMATING STATE OF HEALTH OF BATTERY OF VEHICLE

CROSS-REFERENCE TO RELATED APPLICATIONS

The present application claims priority to Korean Patent Application Number 10-2010-0093085 filed Sep. 27, 2010, the entire contents of which application is incorporated herein for all purposes by this reference.

BACKGROUND OF THE INVENTION

1. Field of the Invention

The present invention relates to an apparatus and a method for estimating the state of health (SOH) of a battery of a vehicle, which can estimate the degree of deterioration of a battery by both temperature change and traveling distance and can accurately estimate the SOH of the battery.

2. Description of Related Art

A battery is used as energy source and/or energy buffer in an electric vehicle, a hybrid electric vehicle, and a fuel cell hybrid electric vehicle. The battery is one of the important parts determining the quality of vehicles. Accordingly, control technology of the battery and the system thereof is important. One area of the control technology is to estimate remaining capacity of the battery by which remaining traveling distance can be determined and the battery can be charged at an appropriate time.

As time goes by and depending on the condition of vehicle and/or battery use, the SOH may not maintain the initial state. To date, the SOH has been estimated from impedance measured or estimated from current and voltage; however, it is not easy to achieve accurate estimation due to errors in measuring the current, voltage, and impedance, or it is very complicated.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY OF THE INVENTION

An aspect of the present invention provides a method for estimating the SOH of a battery of a vehicle. The method comprises the step of: (a) measuring temperature of the battery at predetermined intervals and storing the measured temperatures with respect to time in a temperature distribution data in a memory of a controller of the battery; (b) determining at predetermined intervals whether a time for which the temperature distribution data is stored exceeds a reference time; (e) calculating severity grades according to temperatures from the temperature distribution data, if it is determined that the time exceeds the reference time; (d) calculating deterioration values for a current traveling distance of the vehicle from a traveling distance deterioration map showing degree of deterioration of the battery measured for each traveling distance of the vehicle and estimating degree of deterioration for the current traveling distance and temperature of the vehicle by multiplying the calculated severity grades by the calculated deterioration values; and (e) estimating the SOH of the battery from the estimated degree of deterioration.

Another aspect of the present invention provides an apparatus for estimating the SOH of a battery of a vehicle. The apparatus comprises: a memory storing a severity grade map including severity grade calculated according to a temperature distribution data of a battery cell and a deterioration map including degree of deterioration of the battery measured for each traveling distance; and a controller estimating battery deterioration according to a traveling distance of the vehicle and temperature of the battery, from the severity grade map and the deterioration map in the memory.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

With the apparatuses and methods according to the present invention, the degree of deterioration of the battery can be estimated from temperature change and traveling distance and the SOH of the battery and remaining traveling distance can be accurately estimated.

The methods and apparatuses of the present invention have other features and advantages which will be apparent from or are set forth in more detail in the accompanying drawings, which are incorporated herein, and the following Detailed Description of the Invention, which together serve to explain certain principles of the present invention.

Figure 1:
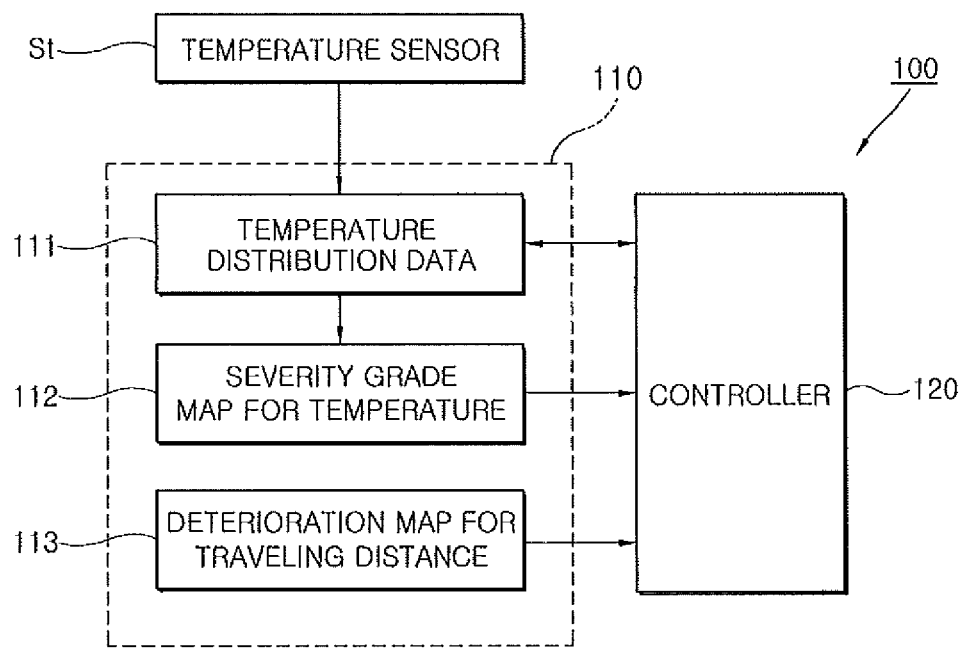
FIG. 1 is a block diagram illustrating an apparatus for estimating the SOH of a battery of a vehicle according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION OF THE INVENTION

Reference will now be made in detail to various embodiments of the present invention(s), examples of which are illustrated in the accompanying drawings and described below. While the invention(s) will be described in conjunction with exemplary embodiments, it will be understood that present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

As shown in FIG. 1, an apparatus 100 for estimating the SOH of a battery of a vehicle includes a memory 110 and a controller 120. The memory 110 includes a temperature distribution data 111, a temperature severity grade map 112, and a traveling distance deterioration map 113. The controller 120 is electrically connected with memory 110 and determines the degree of deterioration of the battery from data transmitted from the memory 110.

Figure 2:
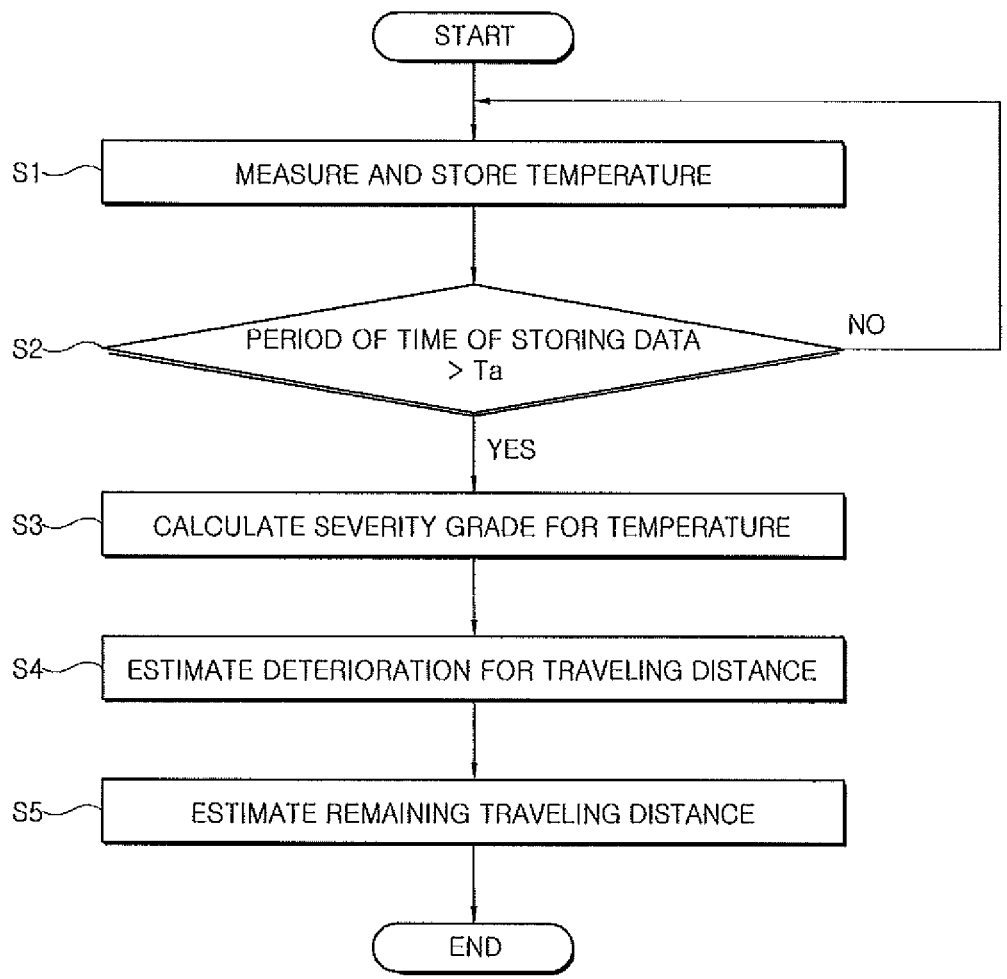
FIG. 2 is a flowchart illustrating a method for estimating the SOH of a battery of a vehicle according to the exemplary embodiment of the present invention of FIG. 1.

A method for estimating the SOH of a battery using the apparatus 100 will be described with reference to FIG. 2. First, in an ignition-on state, the temperature of the battery is measured by a temperature sensor St attached to the battery at predetermined time intervals, the measured temperatures are collected, and the temperature distribution data 111 is stored at predetermined time intervals in the memory 110 (S1).

Figure 3:
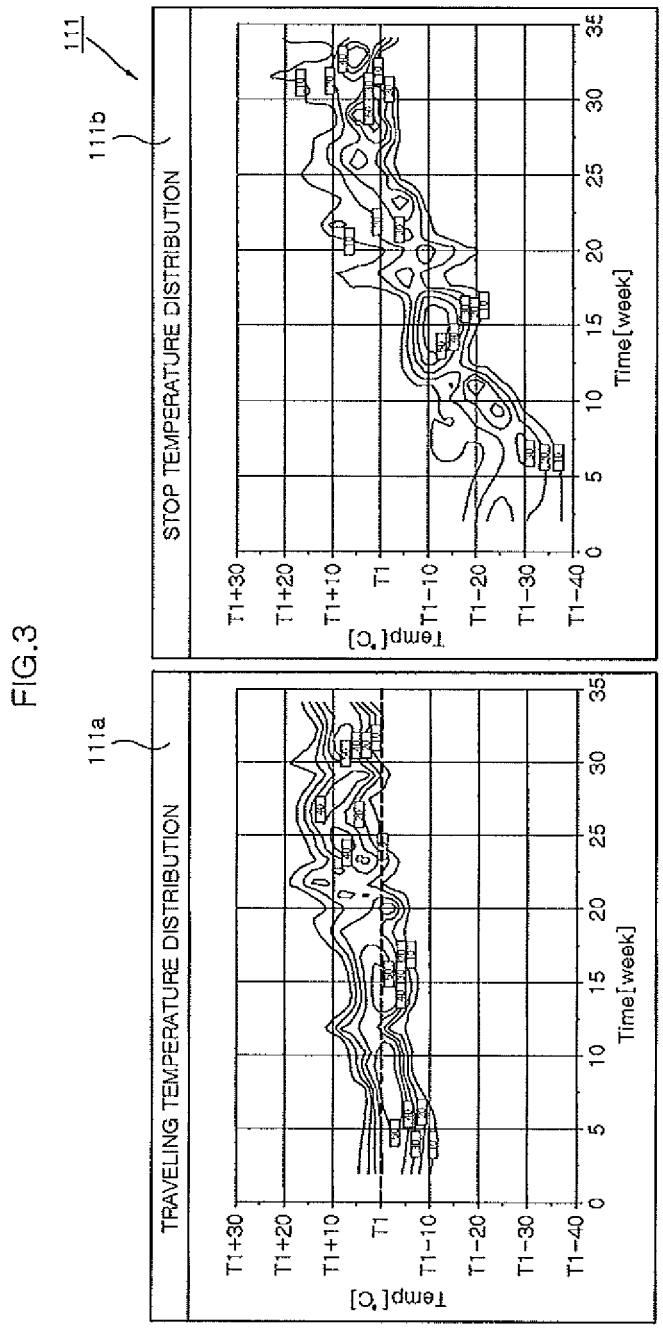
FIG. 3 is a diagram showing an example of a temperature distribution data according to the exemplary embodiment of the present invention of FIGS. 1 and 2.

The temperature distribution data 11 shows the relationship between temperature and time, as shown in FIG. 3 and may include a traveling temperature distribution data 111a, which shows the relationship between temperature and time when the vehicle travels in the ignition-on state and a stop temperature distribution data 111b, which shows the relationship between temperature and time when the vehicle is in stop. The stop temperature distribution data 111b changes in proportion to the change of external temperature. Unlike the stop temperature distribution data 111b, the traveling temperature distribution data 111a hardly changes. Depending on the climate and other driving conditions, the temperature distribution data 11 may include only one of the traveling temperature distribution data and the stop temperature distribution data.

It is determined by the controller 120 at predetermined intervals whether a time for which the temperature distribution data 111 is stored exceeds a reference time Ta (S2).

If it is determined that the time does not exceed the reference time Ta, the temperature of the battery is measured again and an updated temperature distribution data 111 is stored, which is repeated until the time exceeds the reference time Ta. The reference time Ta may be set to any desired value. Preferably, it may be set to one year, for example.

Figure 4:
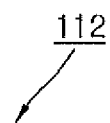
FIG. 4 is a diagram showing an example of a severity grade map used in the exemplary embodiment of the present invention of FIGS. 1 and 2.

On the other hand, if it is determined that the time exceeds the reference time Ta, severity grades according to the change of temperature from the temperature distribution data 111 is calculated (S3). For example, a plurality of temperature values may be set on the basis of temperature distribution data 111, and severity grades for the temperature values may be set. In particular, if a reference temperature T1 is set to an average value of the traveling temperature distribution data 111a, as shown in FIG. 4, the severity grade for the reference temperature T1 may be set to 1. The severity grades for the temperatures higher than reference temperature T1 may be set to values that are larger than 1 by a predetermined number or numbers such that a higher temperature gets a higher severity grade. Similarly, the severity grades for the temperature lower than the reference temperature T1 may be set to values that are less than 1 by a predetermined number or numbers such that a lower temperature gets a lower severity grade.

In addition to the severity grades with respect to the traveling temperature distribution data 111a, severity grades with respect to the stop temperature distribution data 111b may suitably be calculated by using a stop reference temperature T2. As the severity grades with respect to the stop temperature distribution data 111b can be calculated in the same or similar way as those with respect to the traveling temperature distribution data 111a, detailed description thereof is omitted.

The calculated severity grades according to the temperature change are stored in the temperature severity grade map 112. That is, the temperature severity grade map 112 shows severity grade values calculated according to the temperature distribution data 111 for each temperature.

Figure 5:
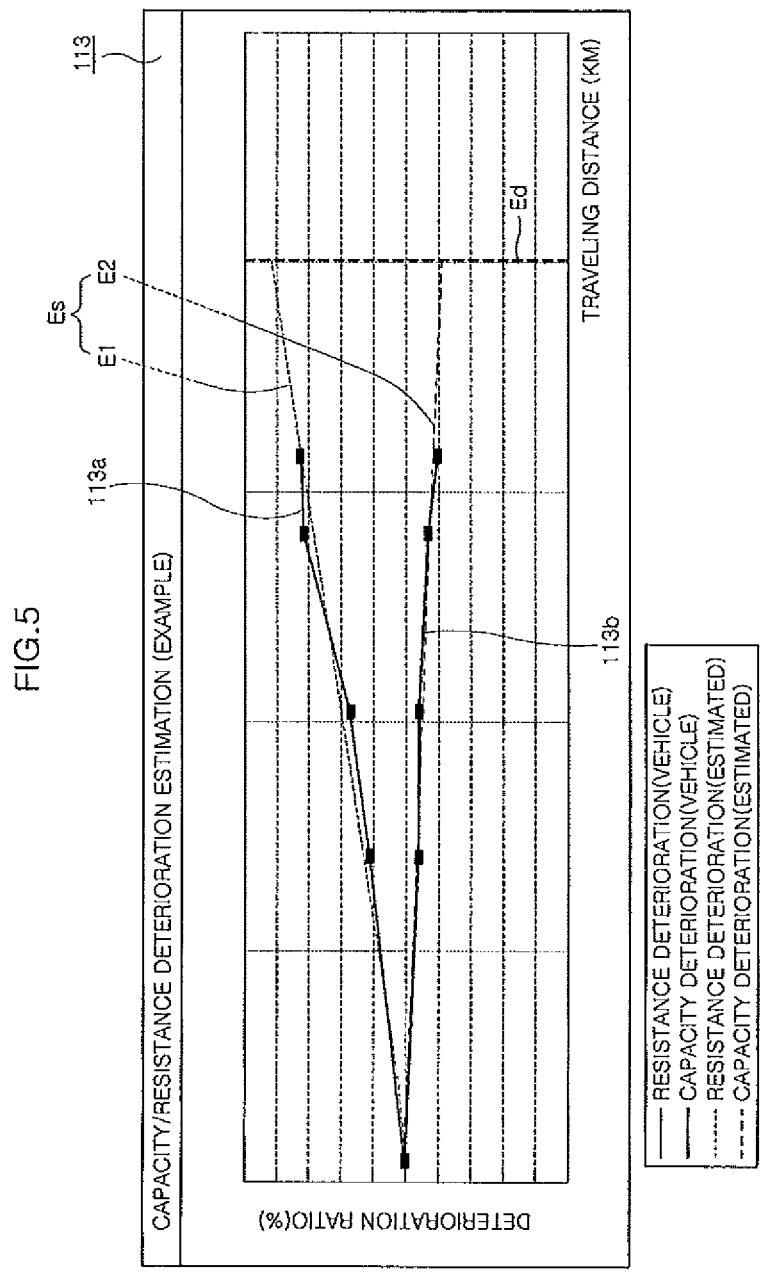
FIG. 5 is a diagram showing an example of a deterioration map for each traveling distance according to the exemplary embodiment of the present invention of FIGS. 1 and 2.

The traveling distance deterioration map 113 shows the degree of deterioration of the battery measured for each traveling distance of the vehicle. The traveling distance deterioration map 113 can be set up through an pre-performed experiment or experiments. FIG. 5 shows an example thereof.

From the traveling distance deterioration map 113, deterioration values 113a, 113b for the current traveling distance of the vehicle can be calculated by the controller 120. The degree of deterioration Es (E1, E2) for the current traveling distance and temperature of the vehicle can then be estimated by multiplying the calculated severity grades by the calculated deterioration values 113a, 113b (S4). The reference number 113a refers to a resistance deterioration value(s) of the battery that is generated due to changes in current of the battery. The reference number 113b refers to a capacity deterioration value(s) 113b of the battery. The reference number E1 refers to a degree of resistance deterioration that is obtained by multiplying the severity grade values by the resistance deterioration values 113a. The reference number E2 refers to a degree of capacity deterioration that is obtained by multiplying the severity grade values by the capacity deterioration values 113b.

From the degrees of deterioration E1, E2, remaining traveling distance of the vehicle can be calculated in the traveling distance deterioration map 113 (S5). In particular, the remaining traveling distance can be calculated by subtracting the current traveling distance of the vehicle from a final travelable distance Ed. The final travelable distance Ed can be set according to the estimated SOH (capacity and resistance deterioration) of the battery, in accordance with the estimated degrees of deterioration E1, E2 of the battery.

With the apparatuses and methods according to the present invention, the degree of deterioration of the battery can be estimated from temperature change and traveling distance and the SOH of the battery and remaining traveling distance can be accurately estimated.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method for estimating the SOH of a battery of a vehicle, the method comprising the step of:
   (a) measuring temperature of the battery at predetermined intervals and storing the measured temperatures with respect to time in a temperature distribution data in a memory of a controller of the battery;

(b) determining at predetermined intervals whether a time for which the temperature distribution data is stored exceeds a reference time;

(c) calculating severity grades according to temperatures from the temperature distribution data, if it is determined that the time exceeds the reference time;

(d) calculating deterioration values for a current traveling distance of the vehicle from a traveling distance deterioration map showing degree of deterioration of the battery measured for each traveling distance of the vehicle and estimating degree of deterioration for the current traveling distance and temperature of the vehicle by multiplying the calculated severity grades by the calculated deterioration values; and (e) estimating the SOH of the battery from the estimated degree of deterioration.

2. The method of claim 1, further comprising, after the step (d), a step of calculating a remaining traveling distance from the estimated degree of deterioration.

3. The method of claim 1, wherein the temperature distribution data includes a traveling temperature distribution data the relationship between temperature and time when the vehicle travels in the ignition-on state and a stop temperature distribution data showing the relationship between temperature and time when the vehicle is in stop.

4. The method of claim 1, wherein the reference time is set to one year.

5. An apparatus for estimating the SOH of a battery of a vehicle, the apparatus comprising:

a memory storing a severity grade map including severity grade calculated according to a temperature distribution data of a battery cell and a deterioration map including degree of deterioration of the battery measured for each traveling distance;

a temperature sensor measuring temperature of the battery at predetermined intervals and storing the measured temperatures with respect to time in the temperature distribution data in the memory; and a controller determining at predetermined intervals whether a time for which the temperature distribution data is stored exceeds a reference time, calculating severity grades according to temperatures from the temperature distribution data, if it is determined that the time exceeds the reference time, calculating deterioration values for a current traveling distance of the vehicle from a traveling distance deterioration map showing degree of deterioration of the battery measured for each traveling distance of the vehicle and estimating degree of deterioration for the current traveling distance and temperature of the vehicle by multiplying the calculated severity grades by the calculated deterioration values, and estimating the SOH of the battery from the estimated degree of deterioration.

6. The apparatus in claim 5, wherein the temperature distribution data includes a traveling temperature distribution data the relationship between temperature and time when the vehicle travels in the ignition-on state and a stop temperature distribution data showing the relationship between temperature and time when the vehicle is in stop.

7. The apparatus in claim 5, wherein the reference time is set to one year.

\* \* \* \* \*